United States Patent [19]
Mizuno et al.

[11] Patent Number: 5,522,452
[45] Date of Patent: Jun. 4, 1996

[54] LIQUID COOLING SYSTEM FOR LSI PACKAGES

[75] Inventors: Tsukasa Mizuno; Hirokazu Miyazaki; Kazuhiko Umezawa, all of Tokyo, Japan

[73] Assignee: NEC Corporation, Tokyo, Japan

[21] Appl. No.: 155,546

[22] Filed: Nov. 22, 1993

Related U.S. Application Data

[63] Continuation of Ser. No. 775,084, Oct. 11, 1991, abandoned.

[30] Foreign Application Priority Data

| Oct. 11, 1990 | [JP] | Japan | 2-272841 |
| Oct. 11, 1990 | [JP] | Japan | 2-272842 |
| Nov. 26, 1990 | [JP] | Japan | 2-321945 |

[51] Int. Cl.$^6$ .............................. F04B 17/04; B60H 1/00
[52] U.S. Cl. ..................... 165/40; 165/80.4; 165/104.33; 361/699; 257/714; 62/259.2; 62/216
[58] Field of Search ....................... 357/82, 81; 257/714, 257/715; 165/80.2, 80.4, 104.33, 40; 174/15.1; 361/699, 717, 718, 719; 62/216, 259.2, 373, 376

[56] References Cited

U.S. PATENT DOCUMENTS

| 2,357,706 | 9/1944 | Toepperwein | 165/2 |
| 3,586,101 | 6/1971 | Chu et al. | 357/82 |
| 3,774,677 | 11/1973 | Antonetti et al. | 357/82 |
| 4,158,875 | 6/1979 | Tajima et al. | 361/384 |
| 4,245,273 | 1/1981 | Feinberg et al. | 361/382 |
| 4,686,606 | 8/1987 | Yamada et al. | 361/385 |
| 4,712,158 | 12/1987 | Kikuchi et al. | 361/385 |
| 4,721,996 | 1/1988 | Tustaniwskyj et al. | 357/82 |
| 4,729,424 | 3/1988 | Mizuno et al. | 165/30 |
| 4,748,495 | 5/1988 | Kucharek | 357/82 |
| 4,750,086 | 6/1988 | Mittal | 361/382 |
| 4,783,721 | 11/1988 | Yamamoto et al. | 361/382 |
| 4,897,762 | 1/1990 | Daikoku et al. | 357/82 |
| 4,928,207 | 5/1990 | Chrysler et al. | 361/385 |
| 4,945,980 | 8/1990 | Umezawa | 165/101 |
| 5,023,695 | 6/1991 | Umezawa et al. | 357/82 |
| 5,036,384 | 7/1991 | Umezawa | 357/82 |
| 5,123,478 | 6/1992 | Hosaka | 165/35 |
| 5,131,233 | 7/1992 | Cray et al. | 62/64 |
| 5,137,079 | 8/1992 | Anderson | 165/38 |

FOREIGN PATENT DOCUMENTS

| 0200221A2 | 11/1986 | European Pat. Off. . |
| 0341950 | 11/1989 | European Pat. Off. . |
| 0480750A2 | 4/1992 | European Pat. Off. . |
| 2126180 | 10/1972 | France . |
| 2413624 | 7/1979 | France . |
| 2636724 | 3/1990 | France . |

OTHER PUBLICATIONS

"Counter-Flow Cooling System", IBM Technical Disclosure Bulletin, vol. 8, No. 11, Apr. 1966, p. 1692, by R. C. Chu.

"Conduction Cooling Module", IBM Technical Disclosure Bulletin, vol. 20, No. 11A, Apr. 1978, pp. 4334-4335, by P. Hwang et al.

(List continued on next page.)

*Primary Examiner*—Rolf Hille
*Assistant Examiner*—David Ostrowski
*Attorney, Agent, or Firm*—Burns, Doane, Swecker & Mathis

[57] ABSTRACT

In a liquid cooling system for a printed circuit board on which integrated circuit packages are mounted, heat sinks are secured respectively to the packages in heat transfer contact therewith. Nozzles are provided in positions corresponding to the heat sinks. A housing is tightly sealed to the printed circuit board to enclose the packages, heat sinks and nozzles in a cooling chamber. A feed pump pressurizes working liquid cooled by a heat exchanger and supplies the pressurized liquid to the nozzles for ejecting liquid droplets to the heat sinks. A liquid suction pump is connected to an outlet of the housing for draining liquid coolant to the heat exchanger and a vapor suction pump is connected to a second outlet of the housing for sucking vaporized coolant to the heat exchanger. The cooling chamber is maintained at a sub-atmospheric pressure to promote nucleate boiling of the working fluid.

12 Claims, 12 Drawing Sheets

OTHER PUBLICATIONS

IEEE International Conference On Computer Design: VLSI in Computers, ICCD '83 Session: The New IBM 4381, "New Internal and External Cooling Enhancements For The Air–Cooled IBM 4381 Module", Oktay, et al., 4 pages (Nov. 1, 1983).

"Cooling Technology for the SX Supercomputer", T. Mizuno et al., NEC Research and Development, No. 88, Jan. 1988, Tokyo, Japan, pp. 65–73.

Patent Abstracts of Japan, vol. 14, No. 268 (E–939), 11 Jun. 1990; & JP–A–2 083 957 (Hitachi Ltd.) 26 Mar. 1990.

Patent Abstracts of Japan, vol. 14, No. 252 (E–934), May 30, 1990; & JP–A–2 073 657 (Hitachi Ltd.) 13 Mar. 1990.

European Search Report for Application No. EP 91309381 and annex thereto (4 pages).

Patent Abstracts of Japan, vol. 15, No. 125 (E–1050), 27 Mar. 1991; and JP–A–3 011 759 (Hitachi Ltd.) 21 Jan. 1991.

Patent Abstracts of Japan, vol. 14, No. 411, (E–973) 5 Sep. 1990; & JP–A–2 155 258 (Fujitsu Ltd) 14 Jun. 1990.

Patent Abstracts of Japan, vol. 014, No. 022 (E–874) 17 Jan. 1990 & JP–A–01 264 248 (Hitachi Ltd) 20 Oct. 1989.

Patent Abstracts of Japan, vol. 015, No. 405, (E–1122) 16 Oct. 1991 & JP–A–0 3165 098 (Fujitsu Ltd) 17 Jul. 1991.

Patent Abstracts of Japan, vol. 015, No. 159 (E–1059) 22 Apr. 1991 & JP–A–03 030 459 (Fujitsu Ltd) 8 Feb. 1991.

European Search Report Application No. 91309381 and annex thereto (7 pages).

Patent Abstracts of Japan, vol. 014, No. 239 (E–0930) 21 May 1990 & JP–A–02 063 147 (Fujitsu Ltd) 2 Mar. 1990.

Patent Abstracts of Japan, vol. 012, No. 423 (E–680) 9 Nov. 1988 & JP–A–63 161 653 (Nippon Telegr & Teleph Corp) 5 Jul. 1988.

"New Internal and External Cooling Enhancements for The Air–Cooled IBM 4381 Module," IBM General Technology Division, East Fishkill, Hopewell Junction, N.Y. 13533, 4 pages (Nov. 1, 1983), S. Oktay, et al.

LIQUID COOLING SYSTEM FOR LSI PACKAGES

This application is a continuation of Ser. No. 07/775,084, filed Oct. 11, 1991, now abandoned.

BACKGROUND OF THE INVENTION

The present invention relates generally to cooling techniques, and more specifically to a liquid cooling system for LSI (large scale integration) packages.

In a prior art liquid cooling system, a plurality of LSI (large scale integration) packages are mounted on a printed circuit board and a plurality of heat sinks are secured respectively on the LSI packages in a heat transfer contact therewith. A housing is sealed against the printed circuit board to define a cooling chamber, which is filled with liquid coolant so that the LSI packages and heat sinks are submerged in the liquid. Local boiling of the liquid occurs at heated areas of the heat sinks, causing columns of bubbles to rise. However, because of the difficulty to precisely maintain the coolant in a condition that causes vaporization to occur in a nucleate boiling state, a film tends to develop in the liquid over the heat sinks. This is what is called "film boiling" which severely limits the efficiency of the cooling operation.

SUMMARY OF THE INVENTION

It is therefore an object of the present invention to provide a liquid cooling system in which no film boiling occurs.

According to one aspect of this invention, there is provided a liquid cooling system for a printed circuit board on which a plurality of integrated circuit packages are mounted and a plurality of heat sinks are secured respectively to the packages in heat transfer contact therewith. The system includes a plurality of nozzles located in positions corresponding to the heat sinks and coupled to a source of pressurized coolant for ejecting droplets of the coolant to the corresponding heat sinks. A housing is tightly sealed to the printed circuit board to define a cooling chamber so that the packages, the heat sinks and the nozzles are contained in the chamber the housing having an outlet opening for allowing heated coolant to be discharged to the outside.

According to a second aspect, the system includes a heat exchanger for producing coolant, and a feed pump for pressurizing the coolant and supplying it to the nozzles. The housing is formed with a liquid outlet opening and a vapor outlet opening. A liquid suction pump is connected to the liquid outlet opening of the housing for draining liquid coolant therefrom to the heat exchanger. A vapor suction pump is connected to the vapor outlet opening of the housing for sucking vaporized coolant therefrom to the heat exchanger. The cooling chamber is maintained at a sub-atmospherric pressure to promote nucleate boiling of the coolant.

According to a third aspect, a plurality of suction pipes are located in positions corresponding to the heat sinks and communicated to the outlet of the housing. The heat sinks and the suction pipes are submerged in coolant liquid. A liquid suction pump is connected to the outlet of the housing to withdraw bubbles over the heat sink through the suction pipes to the heat exchanger for recirculation.

According to a fourth aspect of this invention, a feed pump is connected to the heat exchanger for supplying a flow of pressurized coolant to the housing and a suction pump is connected to the outlet of the housing for discharging heated coolant therefrom to the heat exchanger. A first detector is provided for sensing a coolant flow supplied from the feed pump to the housing and a second detector is provided for sensing a coolant flow discharged from the housing by the suction pump. In response to the coolant flows detected by the first and second detectors, the suction pump is controlled so that a difference between the coolant flows is reduced to a minimum.

BRIEF DESCRIPTION OF THE DRAWINGS

The present invention will be described in further detail with reference to the accompanying drawings, in which.

DETAILED DESCRIPTION

Figure 1:
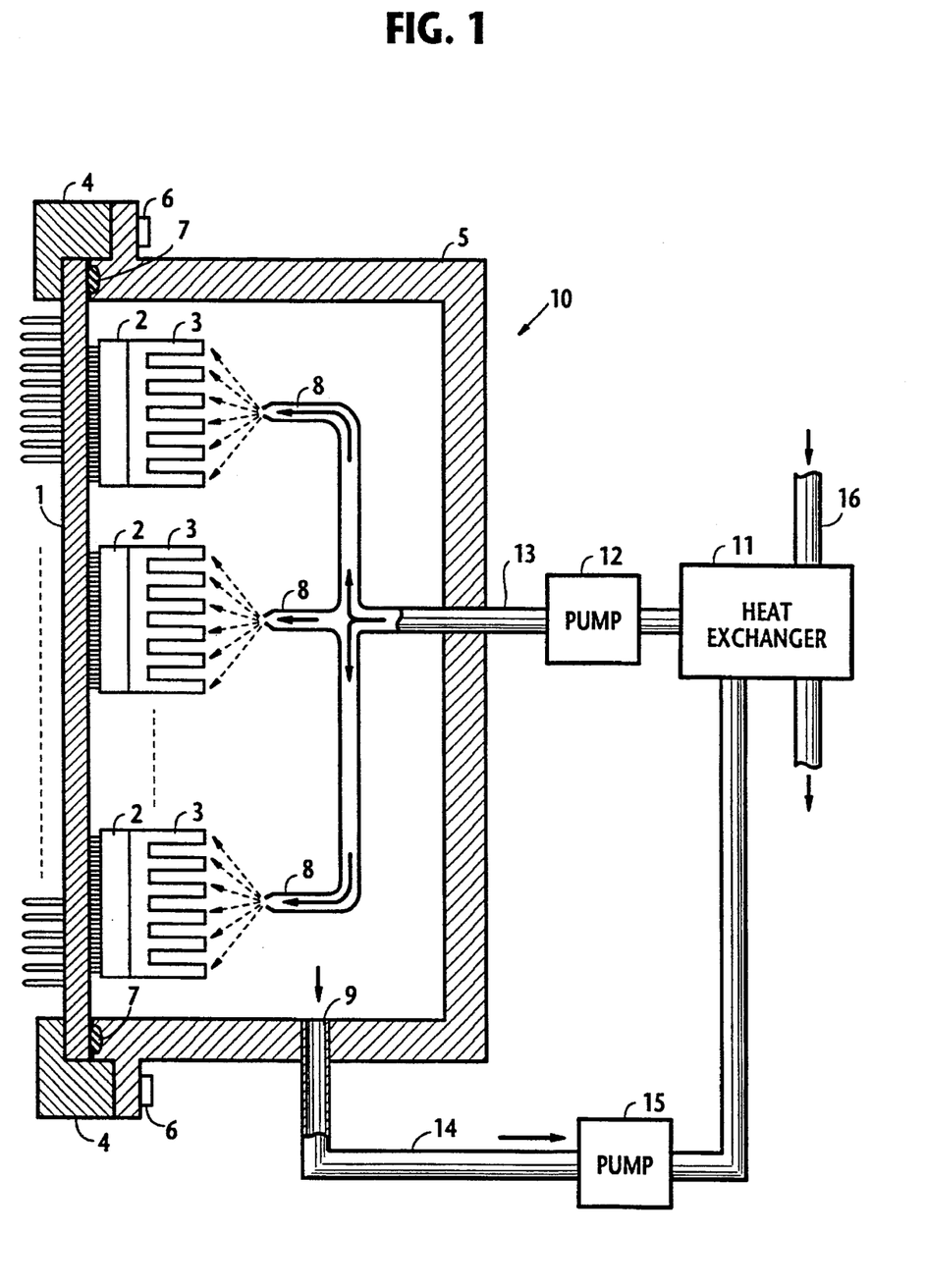
FIG. 1 is a cross-sectional view of a liquid cooling system according to a first embodiment of the present invention.

Referring now to FIG. 1, there is shown a liquid cooling system according to one embodiment of this invention. In the liquid cooling system, a plurality of LSI packages 2 are mounted on a printed circuit board 1 and heat sinks 3 of finned structure are respectively mounted on LSI packages 2 to transfer thermal energy from packages 2 to respective heat sinks 3. The printed circuit board 1 is held in a flange 4 which is clamped to a housing 5 by screws 6 with a sealing member 7 between board 1 and housing 5 to form an air-tight cooling chamber 10. A plurality of nozzles 8 are provided in the cooling chamber in positions corresponding to heat sinks 3. Liquid coolant, such as perfluorocarbon, is supplied from a heat exchanger 11 to a feed pump 12 in which it is pressurized and pumped to nozzles 8 via a conduit 13. The pressurized coolant is ejected from each nozzle 8 to the surface of the corresponding heat sink 3 so that its surface is sprayed with fine particles of coolant.

On contacting the heat sinks, the coolant particles are heated to a boiling point, absorbing thermal energy from the heat sinks. The heated coolant vapor is blown off and removed from the surface areas of the heat sinks by a continuous ejection of the coolant particles, eliminating the possibility of undesirable film boiling and maintaining the surface areas of the heat sinks in a condition optimum to produce nucleate boiling.

The vaporized high-temperature coolant is condensed on the walls of the housing 5 and drained through a liquid outlet opening 9 which is coupled through duct 14 to a suction pump 15. The coolant is pumped to heat exchanger 11 in which it is cooled by a flow of lower temperature fluid flowing through a duct 16 before being recirculated through feed pump 12.

Figure 2:
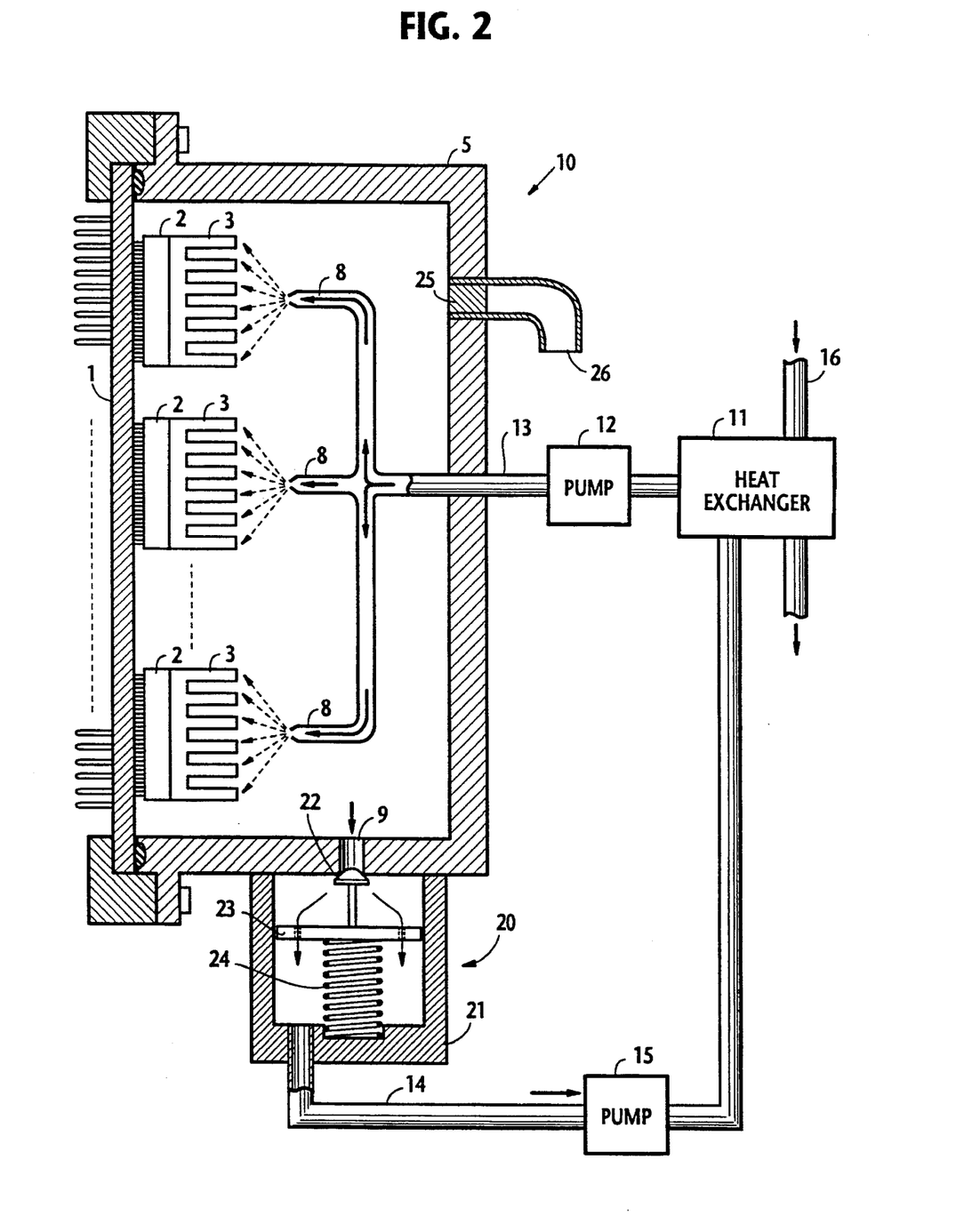
FIG. 2 is a cross-sectional view of the liquid cooling system according to a second embodiment of the present invention.

FIG. 2 is a modified embodiment of this invention in which parts corresponding in significance to those in FIG. 1 are marked with the same numerals as used in FIG. 1. This modification differs from the previous embodiment by the provision of a relief valve 20 and a safety fuse 25. Relief valve 20 comprises a housing 21, a valve member 22 mounted on a movable support 23, and a coiled spring 24 secured to the bottom of housing 21 for urging the valve member 22 against the edge of the liquid outlet opening 9. The inside of valve housing 21 is communicated through conduit 14 to suction pump 15. When the pressure inside the housing 5 exceeds a certain value determined by the spring 24, valve member 22 is moved away from the liquid outlet opening 9, allowing the coolant to flow into the valve housing 21 and sucked through pump 15 to heat exchanger 11 until the pressure is reduced to normal. If relief valve 20 should fail and the inside temperature reaches the melting point of the safety fuse 25, the latter will fuse to provide an opening in the wall of the housing 5 to vent the inside pressure through duct 26.

Figure 3:
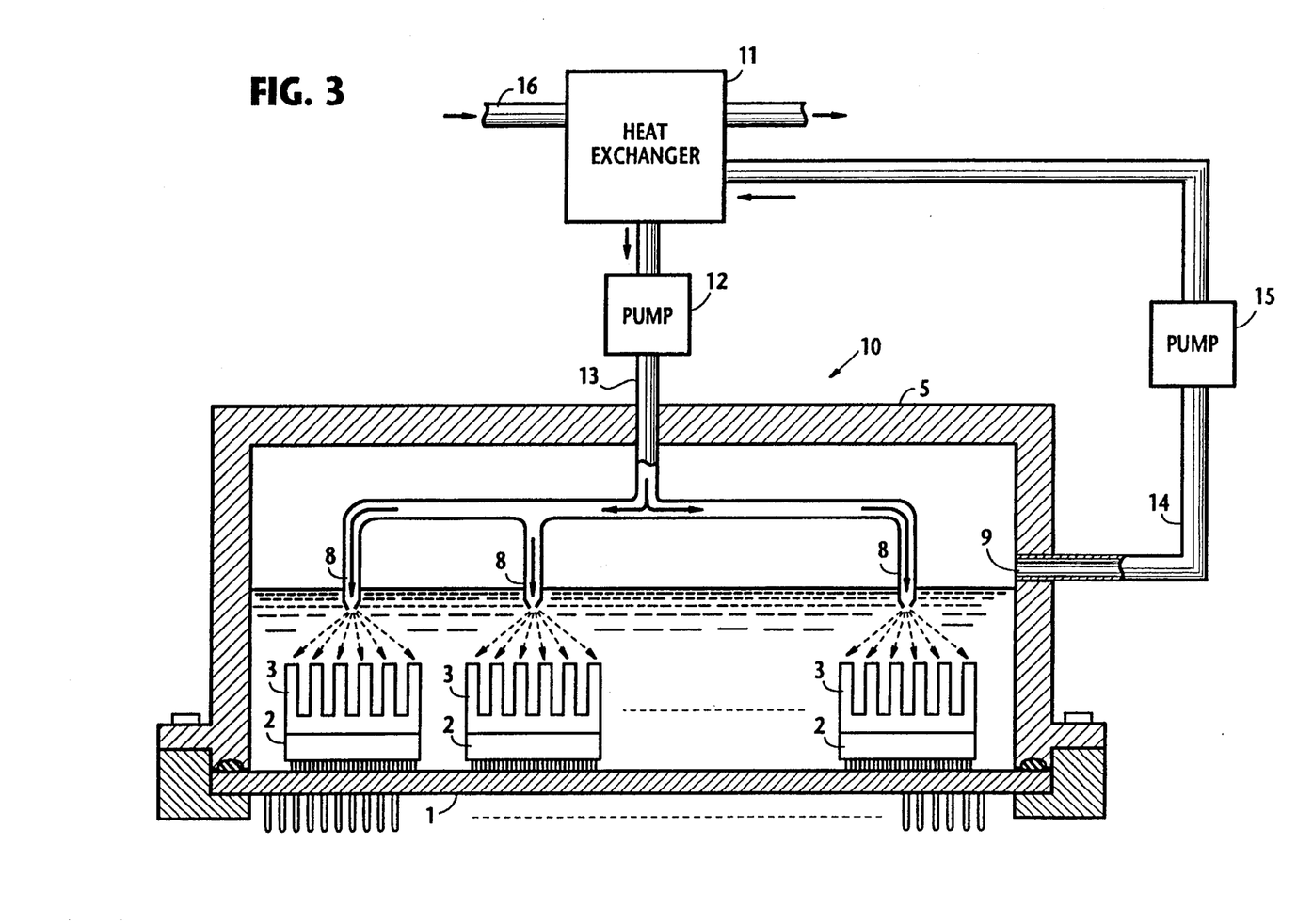
FIG. 3 is a cross-sectional view of the liquid cooling system according to a modification of the first embodiment of the present invention.
Figure 4:
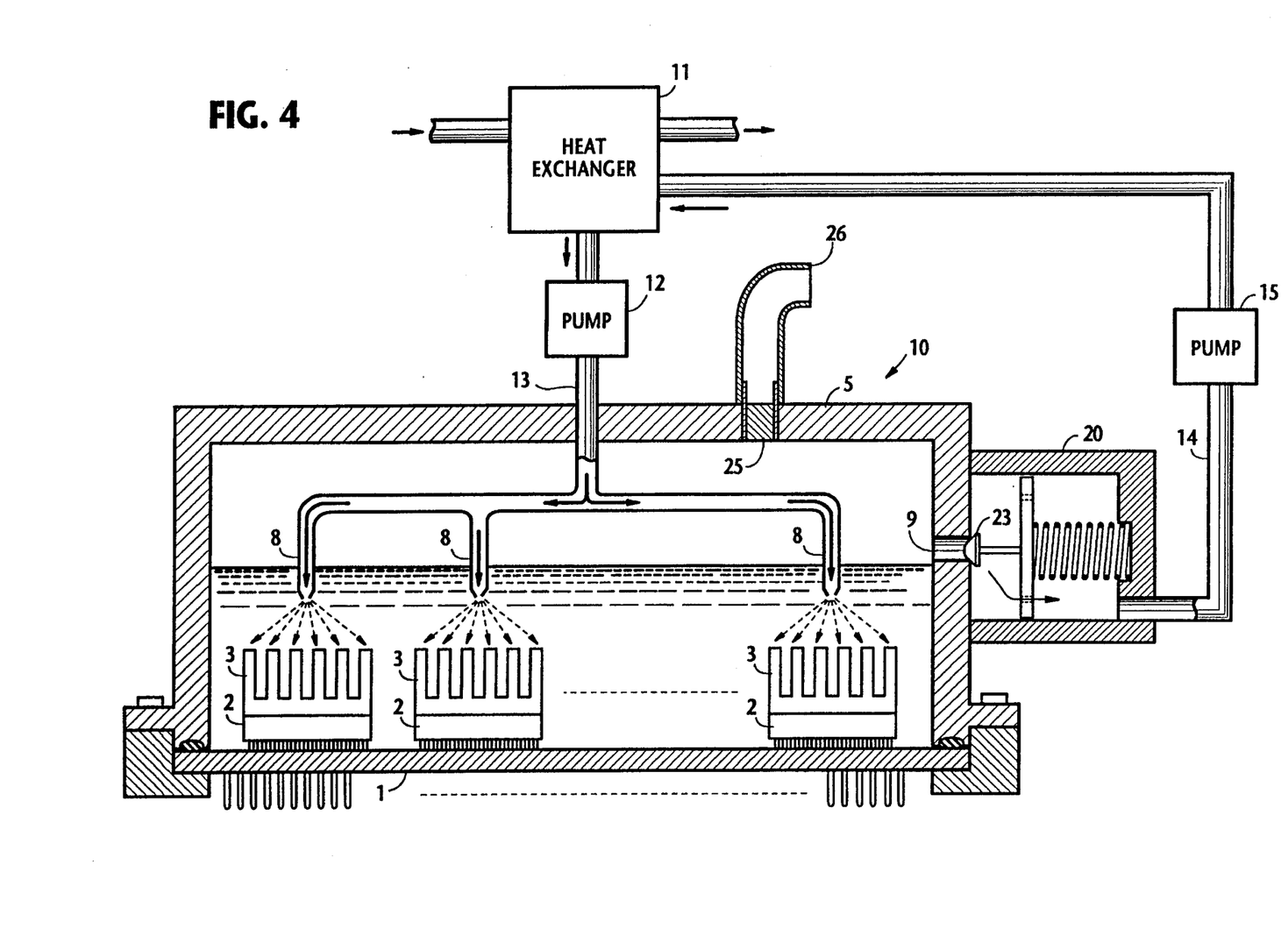
FIG. 4 is a cross-sectional view of the liquid cooling system according to a modification of the second embodiment of the present invention.

In the embodiments of FIGS. 1 and 2, the cooling chamber 10 is held in an upstanding position. However, it can be held in a horizontal position as shown in FIGS. 3 and 4. In these modified embodiments, the liquid outlet opening 9 is located in a position higher than the opening of nozzles 8 so that the condensed coolant will rise and the nozzles 8 and heat sinks 3 are submerged in liquid coolant. The low-temperature working fluid from heat exchanger 11 is pumped into nozzles 8 to eject streams of coolant to heat sinks 3 so that the liquid in the surface area of each heat sink 3 is agitated with a fresh liquid supply to maintain nucleate boiling.

Figure 5:
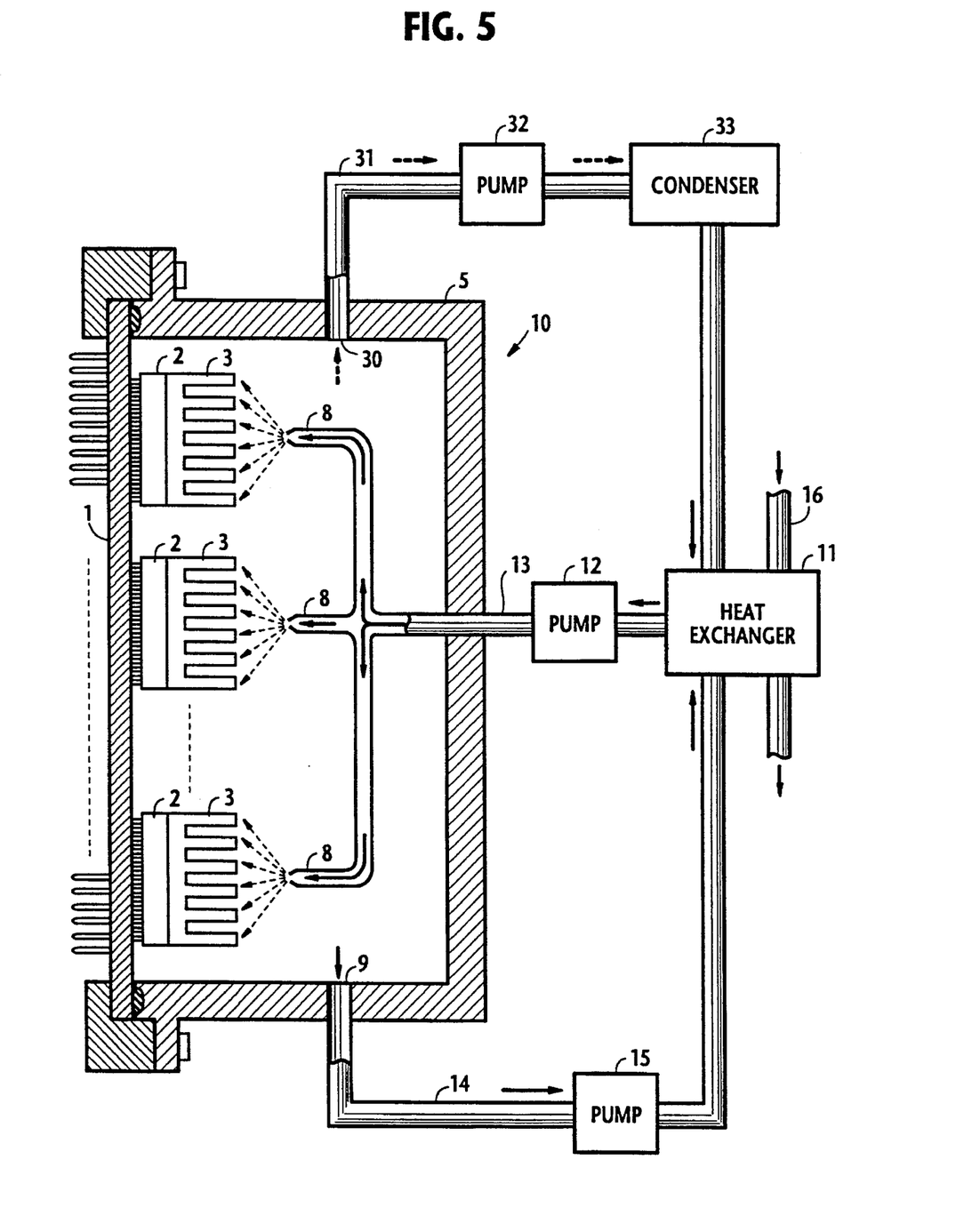
FIG. 5 is a cross-sectional view of the liquid cooling system according to a third modification of the present invention.

FIG. 5 shows a variation of the embodiment of FIG. 1 in which the housing 5 is formed with a vapor outlet opening 30 which is coupled through duct 31 to a suction pump 32 whose output is connected to a condenser 33. In this way, the vaporized coolant is liquefied by condenser 33 and joined with the coolant from pump 15 and cooled down by heat exchanger 11 for recirculation. Due to the provision of the suction pump 32, the inside of the housing 5 is maintained in a sub-atmospheric pressure and produces a condition favoring the tendency of coolant to boil. This tendency increases with a decrease in the inside pressure.

Figure 6:
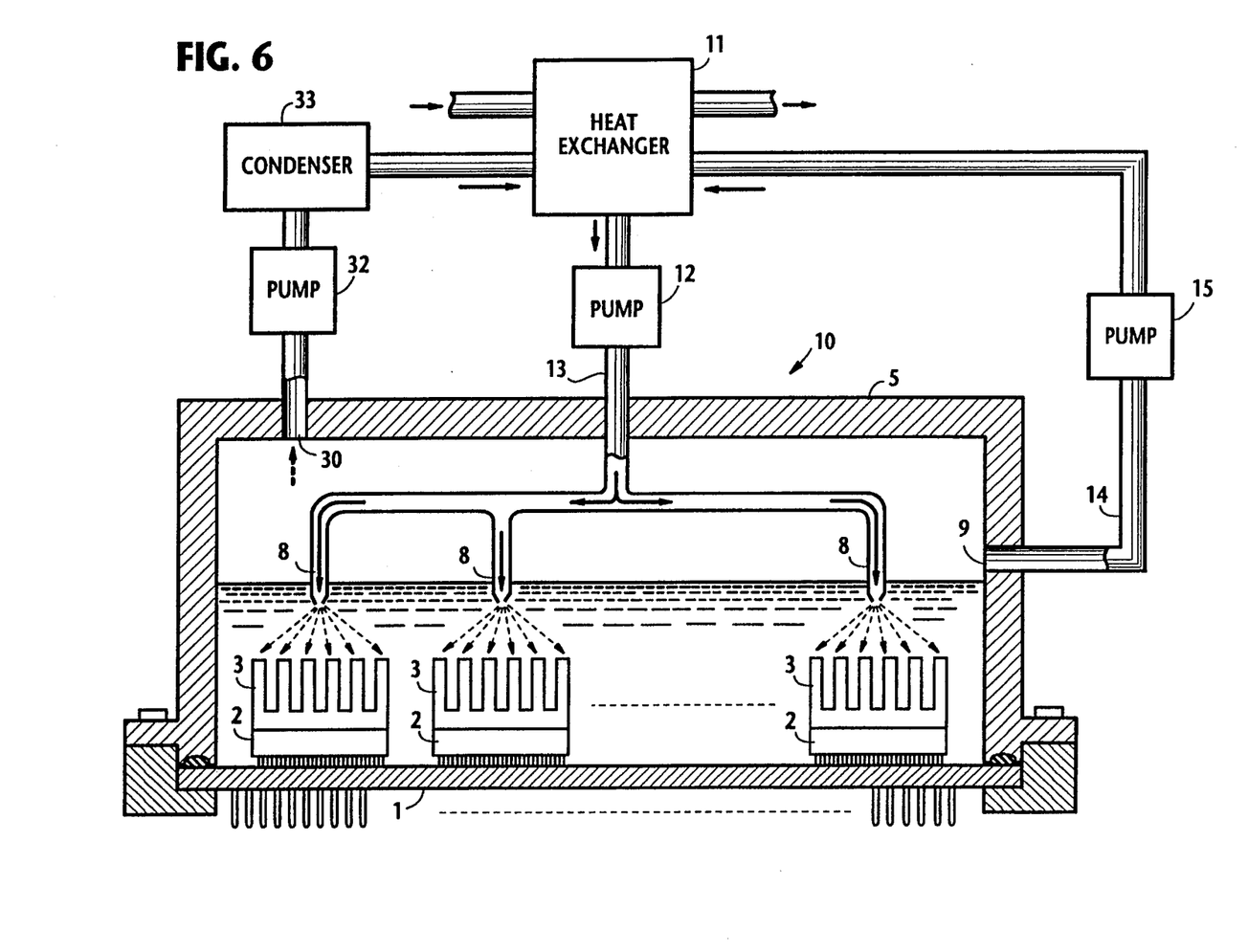
FIG. 6 is a cross-sectional view of the liquid cooling system according to a modification of the third embodiment of the present invention.

The cooling chamber of FIG. 5 is held in a horizontal position as shown in FIG. 6. Heat sinks 3 and nozzles 8 are submerged in liquid coolant and the inside of housing 5 is maintained at sub-atmospheric level by suction pump 32 to favor the condition for nucleate boiling. By ejecting cooled working fluid from nozzles 8 into the liquid under sub-atmospheric pressure, nucleate boiling is effectively produced by combined effects of agitation and pressure reduction.

Figure 7:
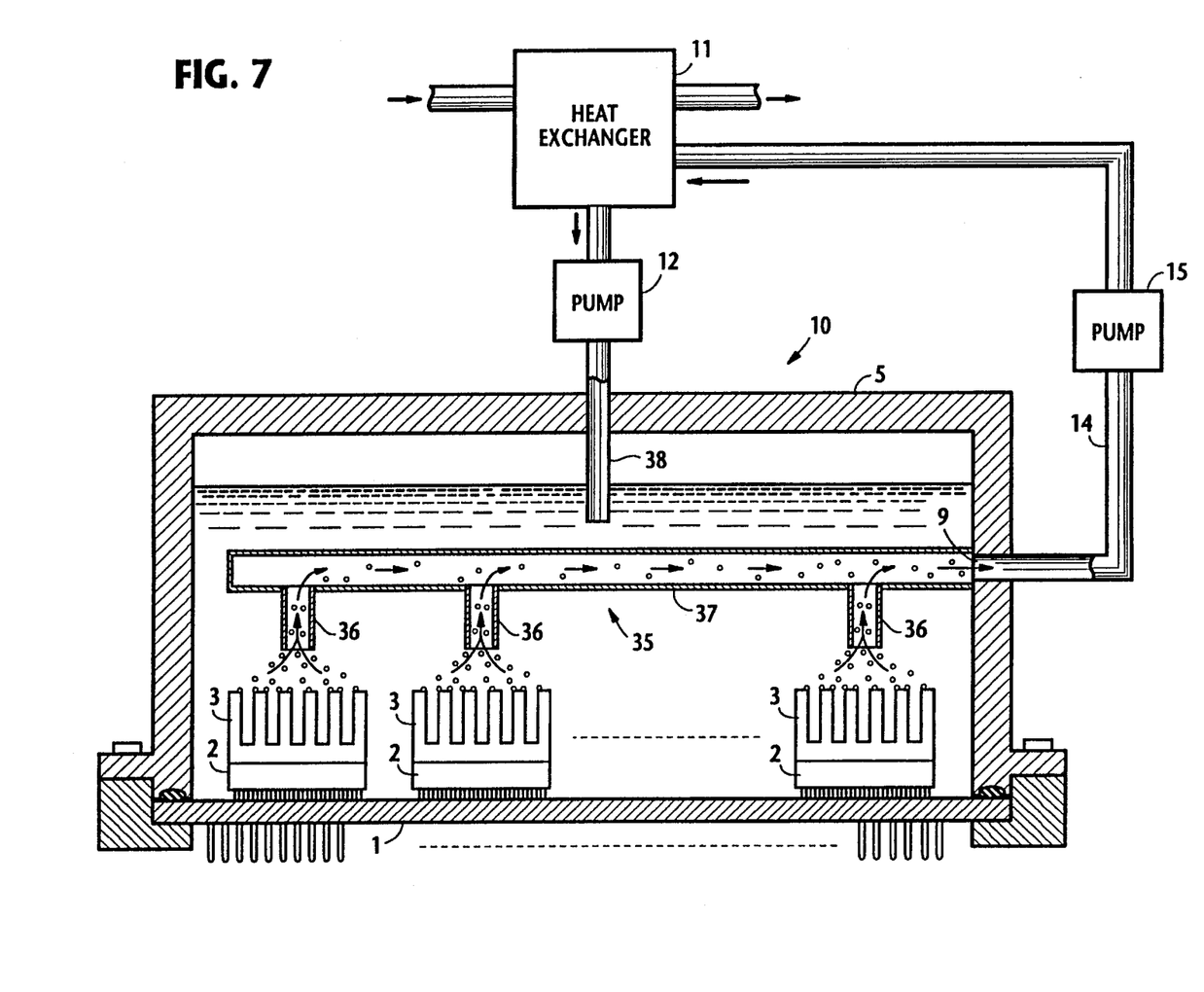
FIG. 7 is a cross-sectional view of the liquid cooling system according to a fourth embodiment of the present invention.

The effect of agitation of coolant can be implemented with a flow of liquid generated in a direction away from the surfaces of heat sinks 3 as shown in FIG. 7. In this embodiment, the heat sinks 3 are submerged in liquid coolant and a piping arrangement 35 is used instead of the nozzles 8. The piping arrangement 35 comprises a plurality of suction pipes 36 downwardly extending from a chamber, or horizontal structure 37 to positions adjacent to heat sinks 3. The horizontal structure 37 is closed at one end and is communicated at the other to the liquid outlet opening 9. By way of suction pipes 36 and horizontal structure 37, suction pump 15 operates to suck in bubbles that are produced on and floating over the heat sinks 3 to heat exchanger 11 together with liquid coolant. Heat exchanger 11 cools down the coolant and recirculates it into the housing 5 through feed pump 12 and supply pipe 38. The effect of agitation is therefore produced by the upward flows of liquid from the surface of each heat sink, disfavoring the tendency of liquid to produce film boiling.

Figure 8:
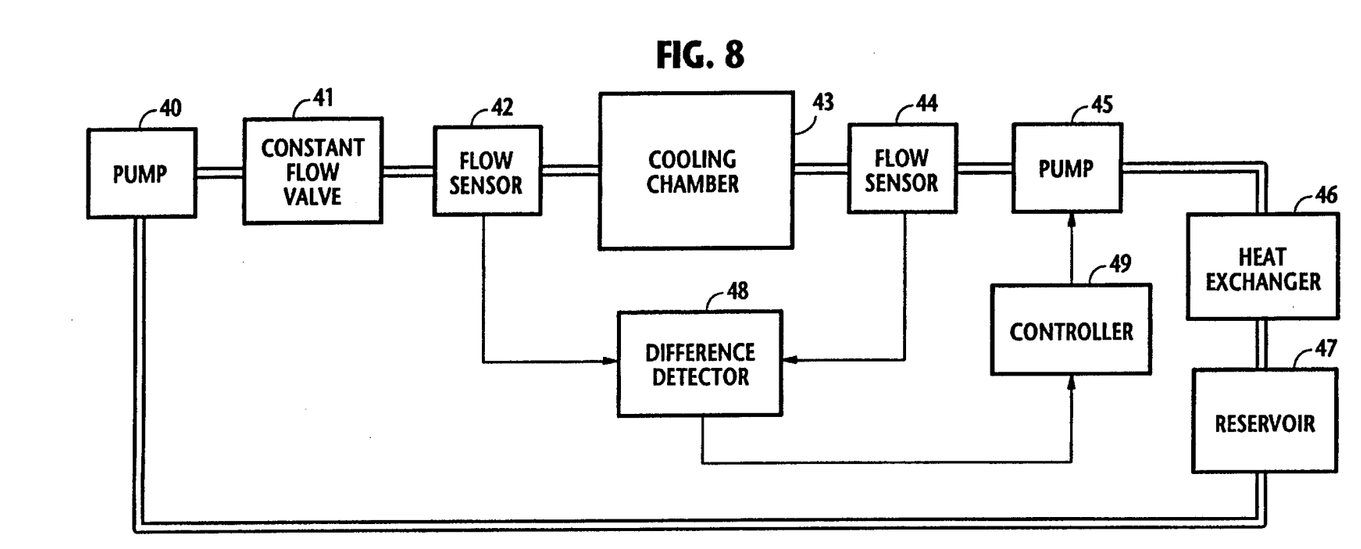
FIGS. 8–14 are block diagrams of various pressure regulating systems for regulating the inside pressure of the cooling chamber.

In preferred embodiments, the inside pressure of the cooling chamber 10 is adaptively controlled so that it is maintained at an optimum condition for nucleate boiling. Variants of the pressure regulating system are shown in FIGS. 8 through 14. In FIG. 8, the pressure regulating system includes a feed pump 40, a constant flow valve 41 and a flow sensor 42, all of which are connected in series from a reservoir 47 to the inlet opening of a cooling chamber 43 which is identical in construction to those shown in FIGS. 1, 3, and 7. Reservoir 47 receives coolant from heat exchanger 46 to accommodate fluctuations that vary as a function of the temperature of the heated working fluid. To the outlet opening of the cooling chamber 43 is connected a flow sensor 44 whose outlet is coupled to a suction pump 45. A heat exchanger 46 and reservoir 47 are connected in series to the output of pump 45. Cooled working fluid in the reservoir 47 is drained by feed pump 40 to constant flow valve 41 in which it is regulated so that a desired volume of coolant is supplied therefrom to cooling chamber 43. Flow sensor 42 measures the volume of liquid supplied to the cooling chamber 43 and generates a signal representative of the measured volume of liquid. Likewise, flow sensor 44 generates a signal representing the volume of liquid discharged from the cooling chamber. The signals produced by flow sensors 42 and 44 are applied to a difference detector 48 in which the difference between the inlet and outlet volumes of the coolant is detected and a signal indicating this difference is coupled to a controller 49. Pump 45 is controlled in response to the output of controller 49 so that the pressure inside the cooling chamber 43 is maintained at an optimum sub-atmospheric level.

Figure 9:
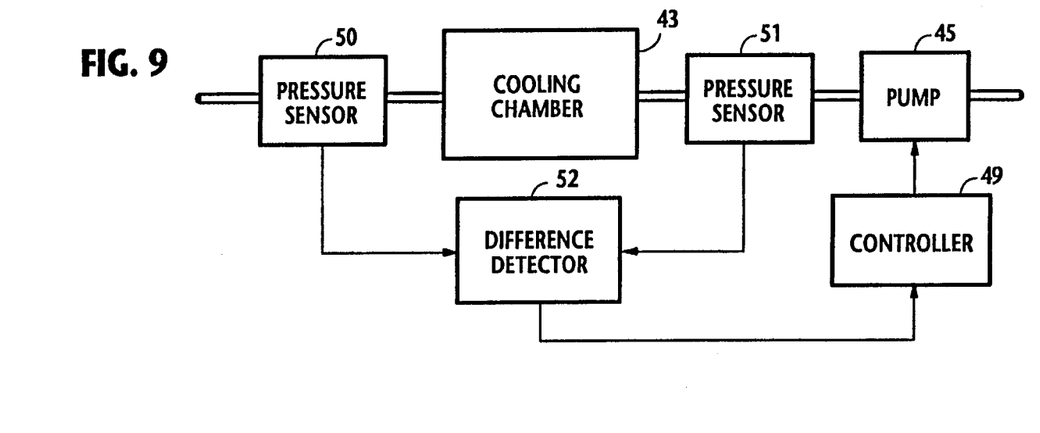

Alternatively, pressure sensors 50 and 51 could equally be as well employed as shown in FIG. 9, instead of flow sensors 42 and 44, to detect inlet and outlet liquid pressures. A difference detector 52 receives signals from the pressure sensors to detect a differential pressure and supplies its output to controller 49. Controller 49 regulates the suction pump 45 to control the differential pressure so that the pressure inside the cooling chamber 43 is maintained at an optimum sub-atmospheric level.

Figure 10:
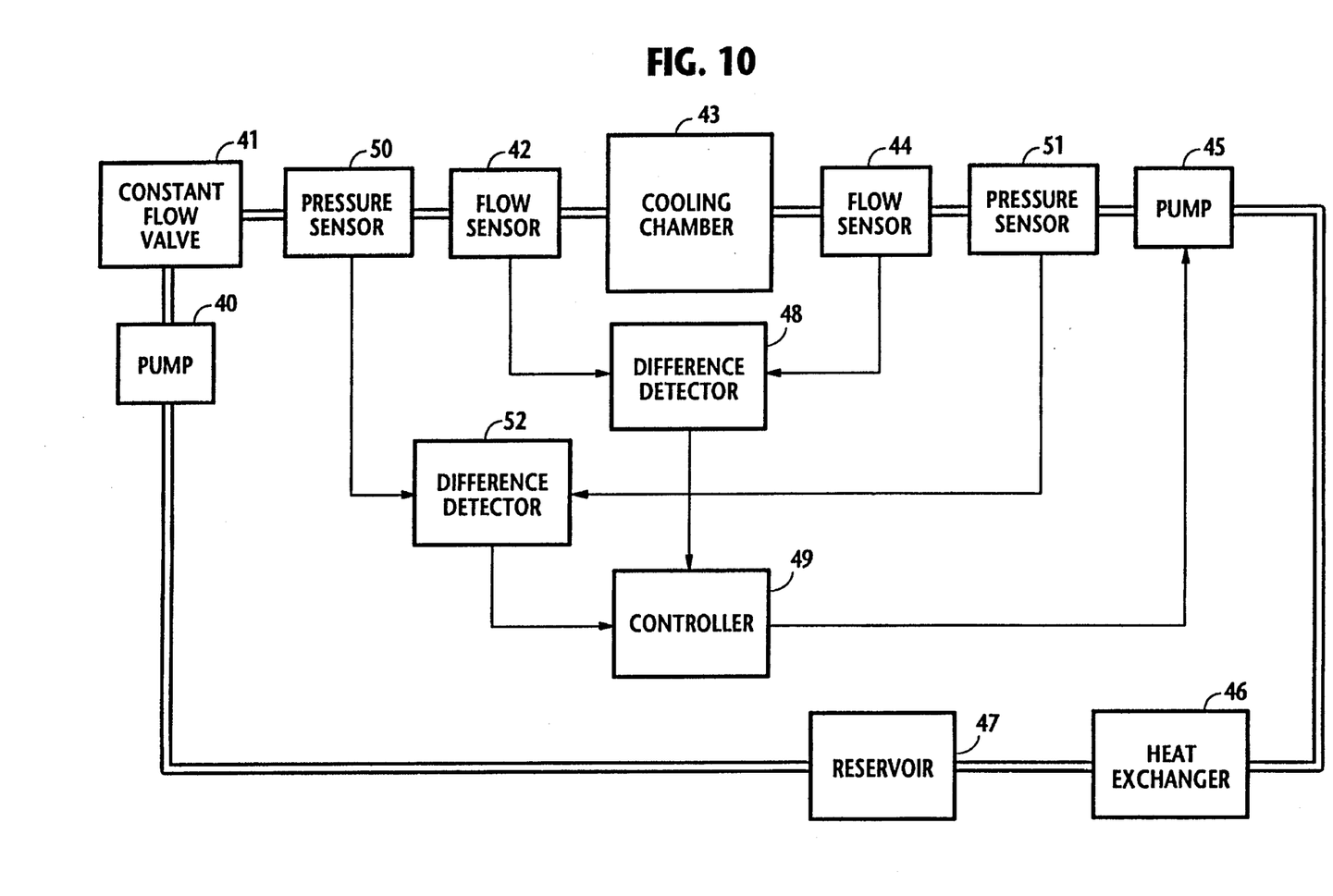

In a further alternative aspect, flow sensors 42, 44 and pressure sensors 50 and 51 are respectively connected in series as shown in FIG. 10. The differential volume and differential pressure of the coolant are respectively detected by difference detectors 48 and 52. Controller 49 is supplied with the outputs of difference detectors 48 and 52 to control the suction pump 45 so that both differences are reduced to a predetermined value and the pressure inside the cooling chamber 43 is maintained at an optimum sub-atmospheric level.

Figure 11:
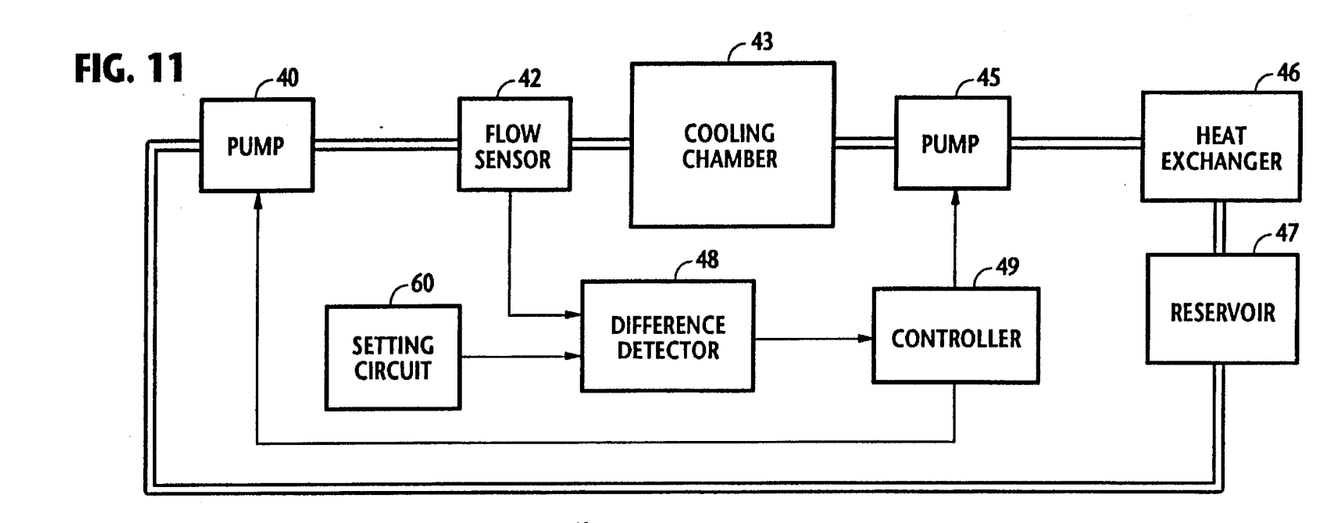

A modification of the embodiment of FIG. 8 is shown in FIG. 11. According to this modification, flow sensor 42 is directly coupled to the outlet of the feed pump 40 and a setting circuit 60 is employed instead of flow sensor 44. Difference detector 48 receives a signal from a setting circuit

Figure 12:
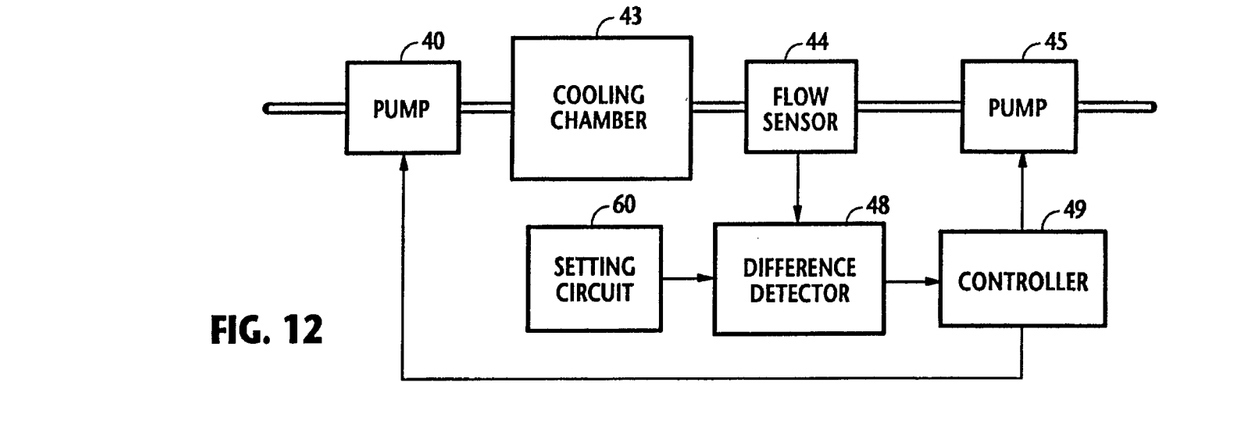

60 indicating a desired volume of liquid flow and a signal from flow sensor 40. The difference between these signals is detected and supplied to controller 49 to control the suction pump 45 so that the difference is reduced to a minimum. As shown in FIG. 12, flow sensor 44 could be employed instead of flow sensor 42. In this alternative form, the difference detector 48 receives the signal from flow sensor 44 for comparison with the signal from the setting circuit 60.

Figure 13:
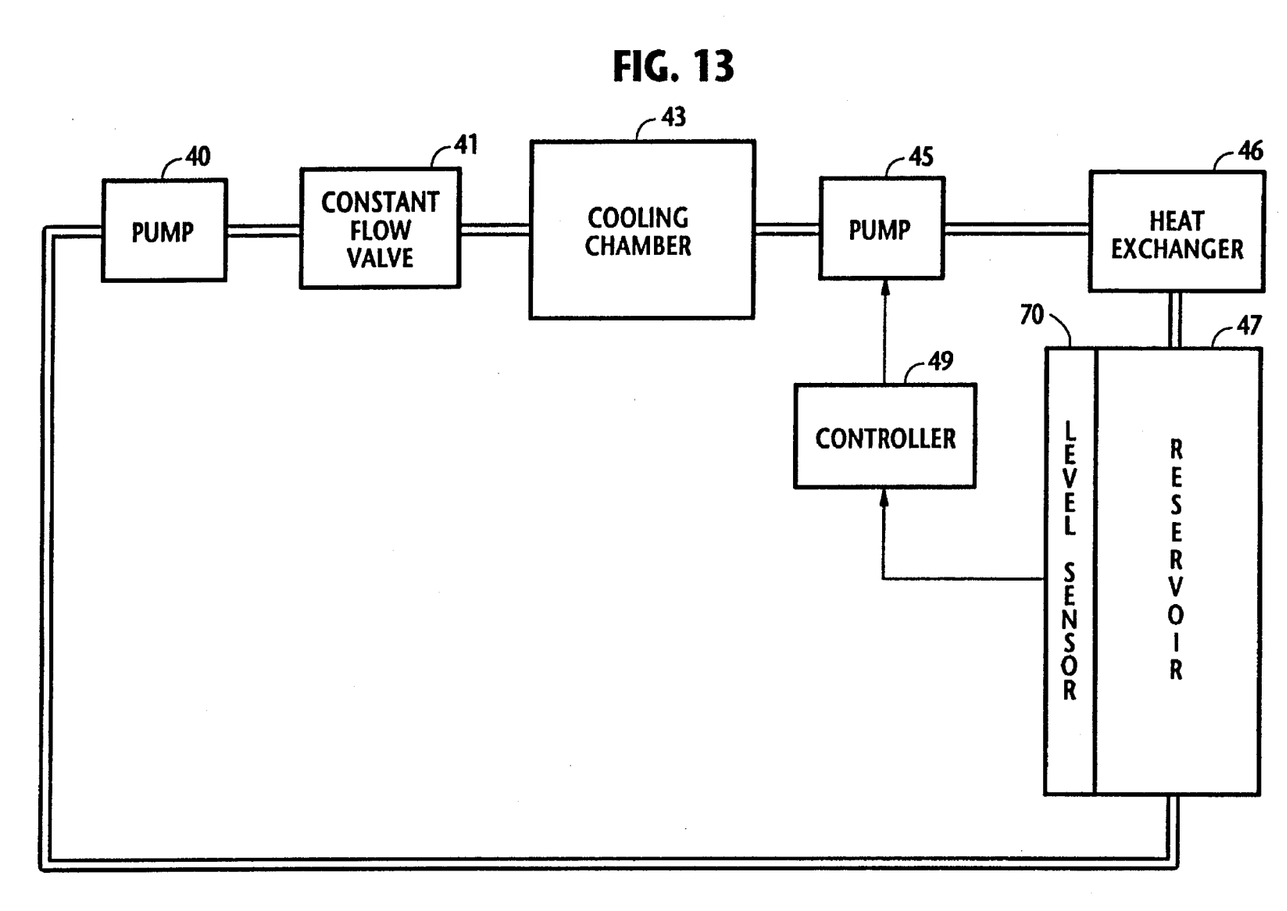

Since the amount of liquid in the reservoir 47 varies corresponding to the pressure inside the cooling chamber 43, a modification of the pressure regulating system is implemented as shown in FIG. 13. According to this modification, cooling chamber 43 is supplied with coolant regulated at a constant volume by constant flow valve 41 and the outlet of the cooling chamber is directly coupled to suction pump 45. A level sensor 70 is provided for measuring the amount of liquid contained in the reservoir 47. A signal indicating the measured volume is applied to controller 49. Suction pump 45 is controlled so that the liquid in reservoir 47 is maintained at a constant level which corresponds to the optimum pressure inside the cooling chamber 43.

Figure 14:
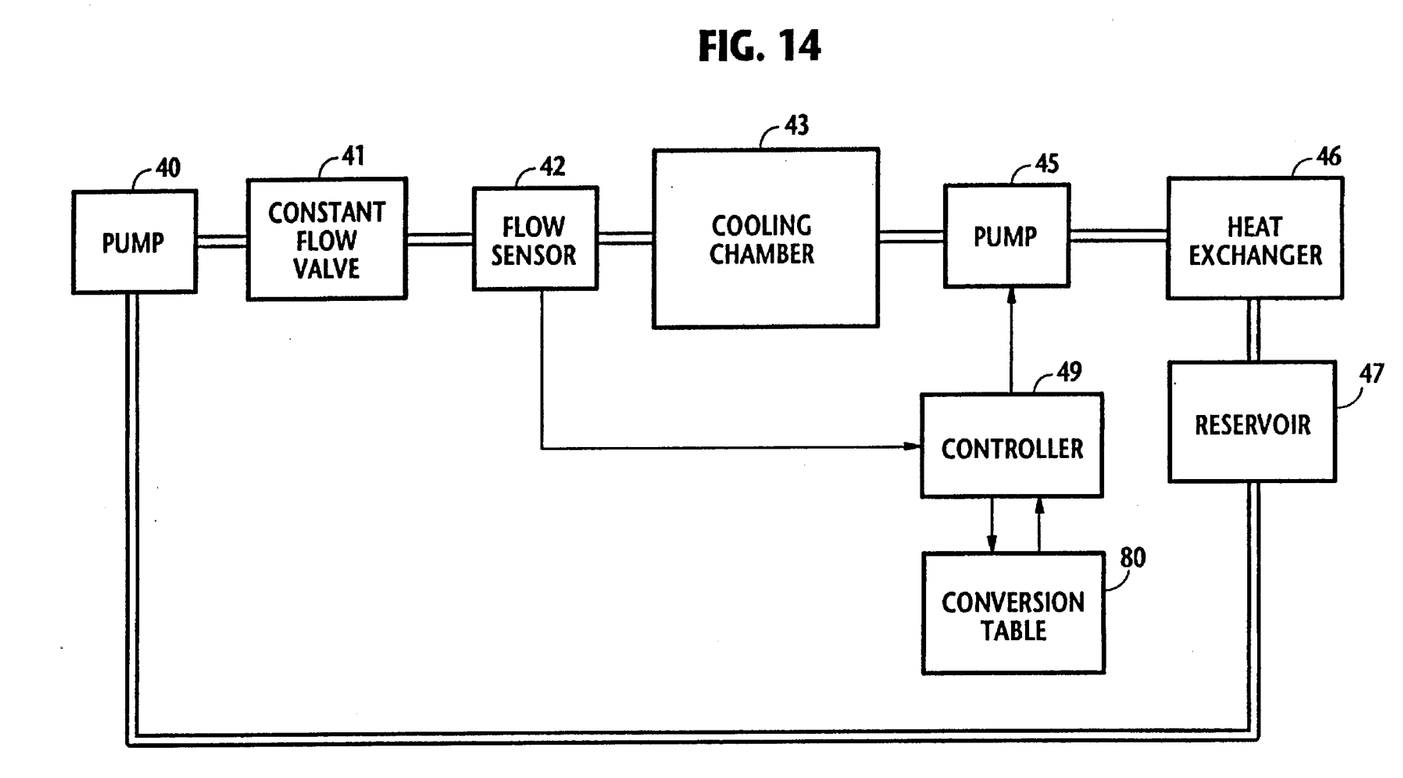

In a further modification, a conversion table 80 may be employed as shown in FIG. 14. Conversion table 80 stores sets of possible inlet volumes of coolant and corresponding optimum outlet volumes of coolant. Controller 49 responds to the output of flow sensor 42 indicating a given inlet volume by accessing the conversion table 80 to recall a corresponding optimum value of outlet flow volume from the table and controls the suction pump 45 according to the recalled value.

What is claimed is:

1. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of nozzles for receiving the pressurized liquid coolant from said feed pump and ejecting droplets of coolant to said heat sinks;

a suction pump for discharging liquid from said cooling chamber to said heat exchanger;

first detector means for detecting a coolant flow supplied to said cooling chamber;

second detector means for detecting a coolant flow discharged from said cooling chamber;

difference detector means for detecting a difference between the detected coolant flows; and control means for controlling said suction pump according to the difference detected by said difference detector means to maintain the pressure inside of said cooling chamber at a sub-atmospheric level.

2. A liquid cooling system as claimed in claim 1, wherein each of said first and second detector means is a flow sensor for detecting the volume of coolant flow.

3. A liquid cooling system as claimed in claim 1, wherein each of said first and second detector means is a pressure sensor for detecting the pressure of coolant flow.

4. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of nozzles for receiving the pressurized liquid coolant from said feed pump and ejecting droplets of coolant to said heat sinks;

a suction pump for discharging liquid from said cooling chamber to said heat exchanger;

a first flow sensor for detecting the volume of coolant flow supplied to said cooling chamber;

a first pressure sensor for detecting the pressure of coolant flow supplied to said cooling chamber;

a second flow sensor for detecting the volume of coolant flow discharged from said cooling chamber;

a second pressure detector for detecting the pressure of coolant flow discharged from said cooling chamber;

first difference detector means for detecting a difference between the detected volumes;

second difference detector means for detecting a difference between the detected pressures; and control means for controlling said suction pump according to the differences detected by said first and second difference detector means to maintain the pressure inside of said cooling chamber at a sub-atmospheric level.

5. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of nozzles for receiving the pressurized liquid coolant from said feed pump and ejecting droplets of coolant to said heat sinks;

a suction pump for discharging liquid from said cooling chamber to said heat exchanger;

detector means for detecting a coolant flow supplied to said nozzles;

setting means for establishing a reference value;

difference detector means for detecting a difference between the detected coolant flow and said reference value; and control means for controlling said feed pump and said suction pump according to the difference detected by said difference detector means to maintain the pressure inside of said cooling chamber at a sub-atmospheric level.

6. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of nozzles for receiving the pressurized liquid coolant from said feed pump and ejecting droplets of coolant to said heat sinks;

a suction pump for discharging liquid from said cooling chamber to said heat exchanger;

detector means for detecting a coolant flow discharged from said cooling chamber;

setting means for establishing a reference value;

difference detector means for detecting a difference between the detected coolant flow and said reference value; and control means for controlling said feed pump and said suction pump according to the difference detected by said difference detector means to maintain the pressure inside of said cooling chamber at a sub-atmospheric level.

7. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of suction pipes respectively disposed adjacent said heat sinks, said packages, said heat sinks and said suction pipes being submerged in liquid coolant;

a suction pump for discharging liquid from said cooling chamber to said heat exchanger;

first detector means for detecting a coolant flow supplied to said cooling chamber;

second detector means for detecting a coolant flow discharged from said cooling chamber;

difference detector means for detecting a difference between the detected coolant flows; and control means for controlling said suction pump according to the difference detected by said difference detector means to maintain the pressure inside of said cooling chamber at a sub-atmospheric level.

8. A liquid cooling system as claimed in claim 7, wherein each of said first and second detector means is a flow sensor for detecting the volume of coolant flow.

9. A liquid cooling system as claimed in claim 7, wherein each of said first arid second detector means is a pressure sensor for detecting the pressure of coolant flow.

10. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of suction pipes respectively disposed adjacent said heat sinks, said packages, said heat sinks and said suction pipes being submerged in liquid coolant;

a suction pump for discharging liquid from said cooling chamber to said heat exchanger;

a first flow sensor for detecting the volume of coolant flow supplied to said cooling chamber;

a first pressure sensor for detecting the pressure of coolant flow supplied to said cooling chamber;

a second flow sensor for detecting the volume of coolant flow discharged from said cooling chamber;

a second pressure detector for detecting the pressure of coolant flow discharged from said cooling chamber;

first difference detector means for detecting a difference between the detected volumes;

second difference detector means for detecting a difference between the detected pressures; and control means for controlling said suction pump according to the differences detected by said first and second difference detector means to maintain the pressure inside of said cooling chamber at a sub-atmospheric level.

11. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of suction pipes respectively disposed adjacent said heat sinks, said packages, said heat sinks and said suction pipes being submerged in liquid coolant;

a suction pump for discharging liquid from said cooling chamber to said heat exchanger;

detector means for detecting a coolant flow supplied to said nozzles;

setting means for establishing a reference value;

difference detector means for detecting a difference between the detected coolant flow and said reference value; and control means for controlling said feed pump and said suction pump according to the difference detected by said difference detector means to maintain the pressure inside of said cooling chamber at a sub-atmospheric level.

12. A liquid cooling system comprising:

a heat exchanger for producing liquid coolant;

a feed pump for receiving the liquid coolant from said heat exchanger and generating pressurized liquid coolant;

a cooling chamber including a plurality of integrated circuit packages, a plurality heat sinks disposed in heat transfer contact with said integrated circuit packages, respectively, and a plurality of suction pipes respectively disposed adjacent said heat sinks, said packages, said heat sinks and said suction pipes being submerged in liquid coolant;

a suction pump for discharging liquid from said cooling chamber to said heat exchanger;

detector means for detecting a coolant flow discharged from said cooling chamber;

setting means for establishing a reference value;

difference detector means for detecting a difference between the detected coolant flow and said reference value; and control means for controlling said feed pump and said suction pump according to the difference detected by said difference detector means to maintain the pressure inside of said cooling chamber at a sub-atmospheric level.

\* \* \* \* \*